AUDIO AMPLIFIER WITH PLURAL AUTOMATIC GAIN CONTROLS
Filed Dec. 8, 1949
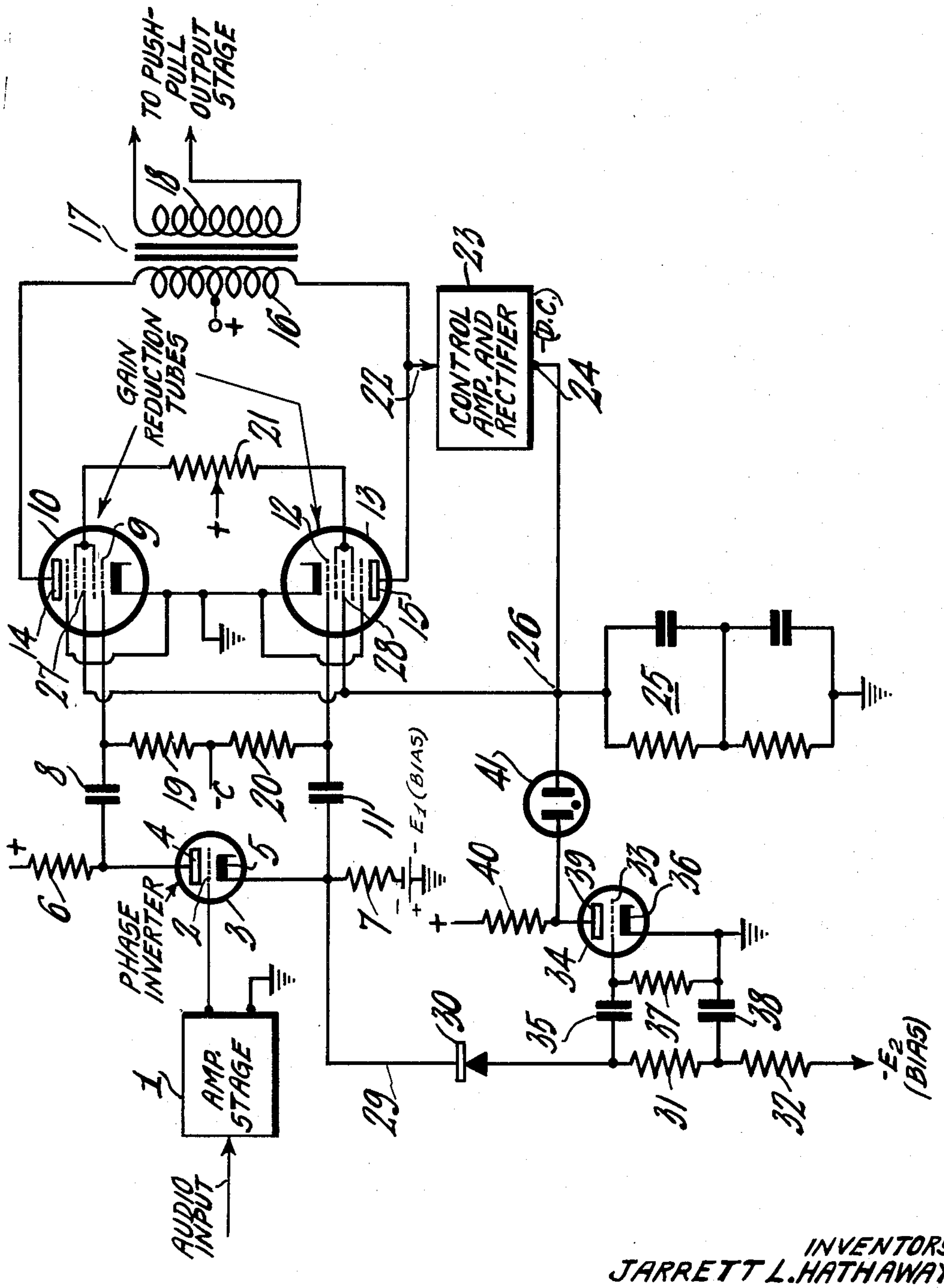
INVENTORS
JARRETT L. HATHAWAY
RAYMOND E. LAFFERTY
BY Harry Tunick
ATTORNEY Patented Oct. 19, 1954 2,692,306

UNITED STATES PATENT OFFICE 2,692,306

AUDIO AMPLIFIER WITH PLURAL AUTOMATIC GAIN CONTROLS

Jarrett L. Hathaway, Manhasset, N. Y., and Raymond E. Lafferty, Fair Lawn, N. J., assignors to Radio Corporation of America, a corporation of Delaware Application December 8, 1949, Serial No. 131,792

5 Claims. (Cl. 179—171)

This invention relates to an audio amplifier, and more particularly to an audio amplifier having an automatic audio gain control (AAGC) circuit incorporated therein.

This invention is particularly applicable to audio amplifiers for use in broadcasting studios. When an input signal of momentary extraordinarily high level and of short duration (on the order of 15 milliseconds, for example), such as a gun shot or similar sound effect, is fed to an AAGC amplifier, limiting lowers the signal level, since the gain control circuit ordinarily has a gain reduction or "attack" time of approximately one millisecond. Such a short burst or short duration signal, at the normal (limited) output level does not sound normally loud nor does it reverberate properly; therefore, the dramatic effect of the gun shot is destroyed and it is not very realistic. Furthermore, when such a short duration signal is fed to the amplifier, the output voltage indicator deflects to only about mid-scale, whereas off-scale deflection occurs when an uncontrolled amplifier (that is, one not having AAGC therein) is used.

Accordingly, an object of this invention is to provide an arrangement for amplifying special sound effects of momentary extraordinarily high level, such as gun shots, without reducing the level of the sound effects, while at the same time permitting AAGC to be used for all other signals of normal level—that is, those within the usual range of sound or voltage magnitudes.

Another object is to devise an arrangement for making gun shots and similar effects sound more realistic when passed through an AAGC amplifier, by increasing the loudness and reverberation of such effects.

A further object is to devise a simple and inexpensive circuit for decommissioning the control circuit of an AAGC amplifier, or for counteracting the effect of such control circuit, for input signal levels above a certain threshold value.

The foregoing and other objects of the invention will be best understood from the following description of an exemplification thereof, reference being had to the accompanying drawing, wherein the single figure is a diagrammatic representation of an amplifier circuit according to this invention.

The objects of this invention are accomplished, briefly, in the following manner:

A portion of the signal passing through an AAGC amplifier is taken off from a point therein ahead of the stage or stages, the gain of which is automatically controlled, and is applied to a biased rectifier. Signals of extraordinarily high level overcome the bias and are rectified, the resulting pulse varying the current flow in a triode to generate a voltage which is in opposition to the negative gain control voltage. This generated voltage causes a glow tube to conduct, said voltage being applied through the glow tube for combination with the gain control voltage; since this generated voltage opposes the gain control voltage, the gain control action is in effect counteracted or neutralized by the presence of the generated voltage. Thus, the gain of the amplifier is in effect not reduced when a signal of momentary extraordinarily high level appears.

Now referring to the drawing, audio input signal is applied to an amplifier stage 1, the output of which is fed to the grid 2 of a triode phase inverter 3 having anode 4 and cathode 5. Tube 3 may be of the 6J5 type. Anode 4 is connected through a load resistor 6 to a source of positive potential, while cathode 5 is connected through resistor 7 and a source of negative bias-$E_1$ (not shown), to ground. Anode 4 is connected through coupling condenser 8 to the first grid 9 of a pentagrid gain-controlled stage or gain reduction tube 10. Similarly, cathode 5 is connected through coupling condenser 11 to the first grid 12 of a similar pentagrid gain-controlled stage or gain reduction tube 13. Tubes 10 and 13 may be of the type known as 6SA7. Tubes 10 and 13 are connected as a push-pull stage, and toward this end the anodes 14 and 15 of the respective tubes are connected to opposite ends of the primary winding 16 of output transformer 17, the secondary 18 of which is coupled to a push-pull output stage (not shown). Positive plate potential is applied to the midpoint of primary 16. Grid 9 is biased through resistor 19 by a suitable source of negative bias potential (not shown), while grid 12 is biased through resistor 20 from the same negative bias source. The second and fourth grids of tubes 10 and 13 are connected to a positive source of bias potential through a balancing potentiometric resistor 21, while the cathodes of tubes 10 and 13 are grounded.

In order to provide AAGC for the audio amplifier illustrated, a connection 22 feeds a portion of the output of stage 10, 13 to a control amplifier and rectifier 23. Unit 23 preferably consists of a tube (for example, of the 6SR7 type) connected in a more or less conventional manner to supply, at output terminal 24 thereof, a direct voltage which is negative with respect to ground and which increases as the output level of stage 10, 13 increases. The voltage appearing at terminal 24 is coupled, via an RC delay and filtering network 25 connected between junction point 26 (connected to terminal 24) and ground, to the two gain control or third grids 27 and 28, respectively, of tubes 10 and 13. The negative gain control voltage appearing at point 26, developed by unit 23, acts to reduce the gain of the stage 10, 13 as the output level of such stage increases, or as the amplifier input signal level increases. The impedance values of a portion of network 25 are such that the AAGC circuit has a very fast gain reduction time or "attack" time, on the order of one millisecond, for example. The AAGC circuit described operates on all signals of normal level, acting to either limit or to compress the amplifier output when the input signal level is high, and to thereby provide an amplifier output which is less than linearly proportional to input for signals above some minimum amplitude.

Due to the operation of the AAGC circuit described and to the time constants of such circuit amplifier input signals of extraordinarily high level, even though of as short duration as fifteen milliseconds, are limited or lowered in level by the amplifier, thereby destroying the dramatic effect of such signals. This is particularly true for certain sound effects such as gun shots.

Therefore, according to this invention an auxiliary circuit is provided for counteracting or neutralizing the effect of the AAGC circuit on stage 10, 13, during the time of reception of amplifier input signals of extraordinarily high level, or above a predetermined threshold level. This auxiliary circuit is actuated by signal potentials from a point ahead of the output of the gain-controlled stage 10, 13. More specifically, a lead 29 extends from cathode 5 of the phase inverter stage to one side of a biased rectifier 30 poled as indicated. Rectifier 30 is preferably a crystal diode such as the 1N54 type, and is biased by having its lower terminal or anode connected through a crystal diode signal load resistor 31 and a crystal diode bias isolation resistor 32 to a source $-E_2$ (not shown) of negative bias potential whose value is less negative than that of a negative bias source $-E_1$ connected to a cathode resistor 7 of the phase inverter tube; the biasing circuit is completed by connecting the upper terminal or cathode of crystal rectifier 30 through resistor 7, and the negative bias source $E_1$ to ground. The crystal 30 is biased to conduct only when the amplifier input signal level exceeds 24 db above the normal threshold of control, such a value being provided only by a signal of extraordinarily high level, such as a gun shot. The predetermined level at which crystal 30 conducts may be called its threshold level, and is determined by the direct bias voltage on such crystal.

Signals of extraordinarily high level exceed the bias voltage on crystal 30 and are rectified thereby. When the extra high level signal is of short duration, the rectified voltage is in the form of a negative pulse, since said crystal is poled as indicated in the drawing. In other words, a sample of the high intensity sound (this sound having high intensity at cathode 5 since such cathode is ahead of gain-controlled stage 10, 13) is converted to a negative D. C. pulse by crystal 30. This negative pulse is capacitively coupled to the grid 33 of a triode amplifier 34 (for example, of the 6J5 type) by means of capacitor 35, which is of such value as to pass only a short duration pulse and not a continued negative potential. As an example, if $-E_1$ is $-14$ volts and $-E_2$ is $-6.5$ volts, under ordinary operating conditions (with no high signal such as a gun shot being fed into the amplifier) the voltage on the anode of control diode 30 will be $-6.5$ volts and the voltage on the cathode of diode 30 will be approximately $+4.5$ volts. If a momentary extraordinarily high signal appear on grid 2 of the inverter tube the cathode 5 of the phase inverter tube will be driven down below $-6.5$ volts and the diode 30 will conduct.

Tube 34 is operated with zero bias, the cathode 36 of such tube being grounded and grid 33 being connected through leak resistor 37 to the cathode. Capacitor 38, connected between the upper end of isolation resistor 32 and ground, serves as a bypass capacitor for such resistor. Anode 39 of triode 34 is connected through a plate resistor 40 to a positive plate potential source. The use of a large plate resistor 40 (which may be on the order of 120,000 ohms, for example) results in low plate voltage when tube 34 is in its normal zero bias state. When the negative pulse is applied to grid 33 of tube 34, the voltage at plate 39 thereof suddenly increases, then returns to its normal value after cessation of the applied negative pulse, due to decrease of current flow in the tube in response to the negative potential applied to grid 33 during the pulse. In other words, the negative voltage pulse on grid 33 puts a positive voltage pulse on plate 39, thus developing a direct voltage at such plate which is in opposition to the negative gain control voltage developed at 24.

A gaseous glow discharge device 41, for example, a neon lamp of the NE48 type, is connected in series between anode 39 and point 26 as indicated. This neon lamp is ignited or caused to conduct by the positive voltage pulse at plate 39, the lamp acting like an open circuit when it does not conduct and like a low impedance when it is ignited. Once the device 41 is ignited, the positive pulse of plate voltage is coupled through such device to point 26 of the AAGC circuit.

The momentary signal of extraordinarily high level also reaches the gain control rectifier 23 and in response thereto a negative voltage is developed at point 26 in the manner above described. If only this negative control voltage were to act on the tubes 10 and 13, the output signal at 18 would be considerably reduced and the full significance of the sound effect lost.

However, according to this invention the positive voltage developed at 39 is applied through 41 to point 26, to there be combined with or algebraically added to the negative gain control voltage from 23. By so combining these two voltages, the resultant gain control voltage applied to grids 27 and 28 remains substantially constant for the duration of the extra high level signal, thereby causing the normal gain of the stage 10, 13 to be momentarily retained, permitting the extra high level signal (of short duration) to be amplified without gain reduction. In other words, the negative bias developed at point 26 is momentarily cancelled, or the gain control circuit is momentarily decommissioned, thus allowing momentary retention of the normal gain of the amplifier (for the duration of the extra high level signal such as a gun shot).

In some cases, signals of extraordinarily high level, other than special sound effects, may operate the auxiliary circuit of this invention to develop a positive voltage at point 26. If it is not desired that such other signals appear in the output of the audio amplifier at a high level, it is within the scope of this invention to provide a switch, at a convenient point in the auxiliary circuit, by means of which the auxiliary circuit may be rendered operative or inoperative at will.

The AAGC circuit operates in the normal manner on tubes 10 and 13, at all times other than for the duration of the extraordinarily high level input signals, since under these conditions the input signals are of insufficient amplitude to overcome the bias on rectifier 30; therefore, no positive voltage pulse appears at 39 and device 41 is nonconducting, thereby acting as an open-circuit to absolutely prevent a positive voltage from being coupled to point 26.

What we claim to be our invention is:

1. In an audio amplifier having at least one stage the gain of which is controllable, means for developing a first voltage which acts to reduce the gain of said stage as the amplifier input signal level increases, a biased series rectifier, coupled to said amplifier at a point ahead of the output of said stage, for rectifying only input signals to such rectifier which are greater than a predetermined threshold level determined by the bias on said rectifier, means controlled by and responsive to the rectified output of said rectifier for developing a second voltage, means including a series connected gaseous discharge device which when conducting has a low series impedance, for combining said first and second voltages in polarity opposition to produce a resultant voltage, and means for applying said resultant voltage to said stage as a gain-controlling voltage therefor.

2. In an audio amplifier having at least one stage the gain of which is controllable, means for developing a first voltage which acts to reduce the gain of said stage as the amplifier input signal level increases, a biased series rectifier, coupled to said amplifier at a point ahead of the output of said stage, for rectifying only input signals to such rectifier which are greater than a predetermined threshold level determined by the bias on said rectifier, a normally conducting electron control device having an output circuit and a control electrode, means for applying the rectified output of said rectifier to said control electrode to decrease current flow in said device in response to such rectified output, thereby developing in said output circuit a second voltage, means including a series-connected gaseous discharge device which when conducting has a low series impedance, for combining said first and second voltages in polarity opposition to produce a resultant voltage, and means for applying said resultant voltage to said stage as gain-controlling voltage therefor.

3. In an audio amplifier having at least one stage the gain of which is controllable, first means for developing a first voltage which acts to reduce the gain of said stage as the amplifer input signal level increases, second means simultaneously responsive to said input signal only when said signal reaches a momentary extraordinarily high level for developing a second voltage, means for combining the simultaneous voltages produced by said first and second means in polarity opposition to produce a momentary resultant differential voltage, and means for applying said momentary resultant differential voltage to said stage as a gain controlling voltage therefor.

4. In an audio amplifier having at least one stage the gain of which is controllable, an automatic gain-control circuit for developing a first voltage which acts to reduce the gain of said stage as the amplifier input signal level increases, means simultaneously responsive to said input signal only when said signal reaches a momentary extraordinarily high level for developing a second voltage, means for combining the simultaneous voltages produced by said means and said automatic gain-control circuit in polarity opposition to produce a momentary resultant differential voltage, and means for applying said momentary resultant differential voltage to said stage as a gain controlling voltage therefor.

5. In an audio amplifier having at least one stage the gain of which is controllable, an automatic gain-control circuit for developing a first voltage which acts to reduce the gain of said stage as the amplifier input signal level increases, an auxiliary circuit having its input coupled to said amplifier at a point ahead of the output of said stage, said auxiliary circuit simultaneously responsive only to a momentary impulsive input signal above a predetermined threshold level for developing an impulsive unidirectional voltage of a duration equal to a duration of said impulsive signal, means for combining the simultaneous voltages produced by said automatic gain-control circuit and said auxiliary circuit in polarity opposition to produce a momentary resultant differential voltage, and means for applying said momentary resultant differential voltage to said stage as a gain controlling voltage therefor.

References Cited in the file of this patent

UNITED STATES PATENTS

| Number | Name | Date |
|---|---|---|
| 1,979,035 | Hammond, Jr. | Oct. 30, 1934 |
| 2,144,605 | Beers | Jan. 24, 1939 |
| 2,156,846 | Getaz | May 2, 1939 |
| 2,172,160 | Dome | Sept. 5, 1939 |
| 2,363,813 | Somers | Nov. 28, 1944 |
| 2,392,384 | Howard | Jan. 8, 1946 |
| 2,462,452 | Yates | Feb. 22, 1949 |
| 2,507,695 | Dean | May 16, 1950 |